United States Patent [19]

Hamza et al.

[11] Patent Number: 5,861,346
[45] Date of Patent: Jan. 19, 1999

[54] PROCESS FOR FORMING SILICON CARBIDE FILMS AND MICROCOMPONENTS

[75] Inventors: Alex V. Hamza, Livermore; Mehdi Balooch; Mehran Moalem, both of Berkeley, all of Calif.

[73] Assignee: Regents of the University of California, Oakland, Calif.

[21] Appl. No.: 507,916

[22] Filed: Jul. 27, 1995

[51] Int. Cl.$^6$ .................................................. C30B 29/36
[52] U.S. Cl. .................. 438/769; 438/768; 438/931; 427/249; 427/255.4; 117/951
[58] Field of Search .................. 437/100; 427/249, 427/255.4; 423/445 B; 117/951; 438/931, 765, 768, 769

[56] References Cited

U.S. PATENT DOCUMENTS

| | | | |
|---|---|---|---|
| 5,053,255 | 10/1991 | Boeglin | 427/249 |
| 5,209,916 | 5/1993 | Gruen | 423/446 |
| 5,415,126 | 5/1995 | Loboda et al. | 427/249 |
| 5,558,903 | 9/1996 | Bhushan et al. | 427/249 |

OTHER PUBLICATIONS

Chen, D. et al "Fabrication of SiC Films on Si(100) using a C_60 molecular source" Electronics Letters, vol. 30, No. 12, pp. 1007–1008, Jun. 1994.

Henke, S. et al "Synthesis of epitaxial b–SiC by C_60 carbonization of silicon" J. Appl. Phys., vol. 78, No. 3, pp. 2070–2073, Aug. 1995.

Surface Science Letters, Growth of Silicon Carbide Films Via $C_{60}$ precursors, A.V. Hamza et al; Lawrence Livermore National Laboratory, pp. L1129–L1135, vol. 317, Oct. 1994.

SiC Microcomponents Via Reaction of $C_{60}$ With Silicon, M. Balooch et al., J. Vac. sci. Technol. B 12(6), Nov./Dec. 1994, pp. 3218–3219.

The Chemisorption of $C_{60}$ on Si (100)—(2X1), A.V. Hamza et al., Chemical Physics Letters, vol. 201, No. 5,6, pp. 404–408.

$C_{58}$ Production From Dissociation of $C_{60}$ by Scattering From Silica and Highly Oriented Pyrolytic Graphite, A.V. Hamza et al., Chemical Physics Letters 228 (1994), pp. 117–121.

Observation of $C_{60}$ Cage Opening on Si (111)—(7X7), M. Balooch et al., Appl. Phys. Lett. 63 (2), Jul. 12, 1993, pp. 150–152.

Surface Mobility of $C_{60}$ On $SiO_2$, M. Moalem et al., J. Chem. Phys. 99 (6), 15 Sep. 1993, pp. 4855–4859.

Sappire (1120) Surface: Structure and Laser–Induced Desorption of Aluminum, M.A. Schildbach et al., Physical Review B, vol. 45, No. 11, pp. 6197–6206.

Double Doman Solid $C_{60}$ on Si (111) 7X7, Hang Xu et al., Physical Review, vol. 70, No. 12, pp. 1850–1853.

Fullerene ($C_{60}$) Adsorption on Si Surfaces, T. Sakurai et al., Applied Surface Science 67 (1993) 281–285.

Adsorption of $C_{60}$ and $C_{84}$ on the Si (100) 2 X 1 Surface Studied by Using the Scanning Tunneling Microscope, X.D. Wang et al., Physical Review, vol. 47, No. 23.

Temperature Effects of Adsorption of $C_{60}$ Molecules on Si (111)—(7x7) Surfaces, Dong Chen et al., Physical Review, vol. 49, No. 11, pp. 7612–7619.

*Primary Examiner*—R. Bruce Breneman
*Assistant Examiner*—Anita Alanko
*Attorney, Agent, or Firm*—Daryl S. Grzybicki

[57] ABSTRACT

Silicon carbide films and microcomponents are grown on silicon substrates at surface temperatures between 900 K and 1700 K via $C_{60}$ precursors in a hydrogen-free environment. Selective crystalline silicon carbide growth can be achieved on patterned silicon-silicon oxide samples. Patterned SiC films are produced by making use of the high reaction probability of $C_{60}$ with silicon at surface temperatures greater than 900 K and the negligible reaction probability for $C_{60}$ on silicon dioxide at surface temperatures less than 1250 K.

19 Claims, 2 Drawing Sheets

PROCESS FOR FORMING SILICON CARBIDE FILMS AND MICROCOMPONENTS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to a process for producing silicon carbide films and microcomponents via a $C_{60}$ precursor.

2. Description of Related Art

Silicon carbide is a promising material for many semiconducting applications, in particular for integrated circuits operating at extremes of temperature, power, speed, or frequency. Silicon carbide has a wide band gap and excellent physical stability, in addition to high electron mobility, thermal conductivity, and hardness. But silicon carbide is not widely used because of the difficulty in growing large-area single crystals and in etching silicon carbide to form the necessary microstructures.

Chemical vapor deposition techniques are currently available to produce silicon carbide thin films from silane or disilane and hydrocarbon gases (e.g., methane) at high substrate temperatures (>1300 K). However, growth is relatively slow and can incorporate hydrogen into the film from the reactants. The hydrogen from the silane and methane are detrimental to device performance. In addition, the high temperatures make the processing expensive. Dry etching techniques for silicon carbide are also available, but are slow and difficult to control to produce clean, smooth surfaces.

The interaction of $C_{60}$ clusters with silicon wafers has been studied by the applicants and others (Hamza and Balooch [1,2]; Sakurai et al. [3]; Weaver et al. [4]; and Creager et al. [5]). These studies have shown that at low temperatures, the $C_{60}$ cluster adsorbs strongly, but intact, to the clean silicon surface. Balooch and Hamza [2] documented the reaction of $C_{60}$ with silicon and observed the opening of the $C_{60}$ cage at temperatures >900 K. Hamza and Balooch have also pointed out that the solubility of carbon in silicon is very small at temperatures below 1600 K.

It has been assumed, then, that the carbon desorbs during annealing at >1150 K, and silicon carbide is not formed. Although some researchers (Sakurai et al. [3]; Chen and Sarid [6]) have claimed to observe SiC island nucleation after heating above 1100 K, the scanning tunneling microscopy results do not have sufficient resolution to show the lattice parameter corresponding to SiC. Thus, their claims of SiC islands are unconfirmed.

A process for forming silicon carbide films and microcomponents at low temperatures in a hydrogen-free environment would be advantageous, particularly in making semiconductor devices. The present invention builds on research conducted by the applicants and provides a method for growing silicon carbide on silicon wafers, producing crystalline thin films and patterns via reaction of silicon with $C_{60}$.

REFERENCES

[1] A. V. Hamza and M. Balooch, Chemical Physics Letters 201, 404 (1993).

[2] M. Balooch and A. V. Hamza, Appl. Phys. Lett. 63, 150 (1993).

[3] Tomihiro Hashizume, Xiang-Dong Wang, Yuichiro Nishina, Hisanori Shinohara, Yahachi Saito, Young Kuk, and Toshio Sakurai, Jpn. J. Appl. Phys. 31, L880 (1992); T. Sakurai, X. D. Wang, T. Hashizume, Y. Nishina, H. Shinohara, and Y. Saito, Applied Surface Science 67, 281 (1993); X. -D. Wang, T. Hashizume, H. Shinohara, Y. Saito, Y. Nishina, and T. Sakurai, Phys. Rev. B47, 15923 (1993).

[4] Y. Z. Li, M. Chander, J. C. Patrin, J. H. Weaver, L. P. F. Chibante, and R. E. Smalley, Phys. Rev. B45, 13837 (1992).

[5] Hang Xu, D. M. Chen and W. N. Creager, Phys. Rev. Lett. 70, 1850 (1993).

[6] D. Chen and D. Sarid, Phys. Rev. B49, 7612 (1994).

[7] M. Moalem, M. Balooch, A. V. Hamza, W. J. Siekhaus, and D. R. Olander, Journal of Chemical Physics 99, 4855 (1993).

[8] M. A. Schildbach and A. V. Hamza, Phys. Rev. B45 (1992) 6197.

SUMMARY OF THE INVENTION

The present invention is a process for growing crystalline thin films of silicon carbide on silicon substrates via reaction of silicon with $C_{60}$. A silicon carbide film is produced by exposing a clean silicon substrate to $C_{60}$ at surface temperatures between 900 K and 1700 K. Surface silicon atoms react with "opened" $C_{60}$ clusters to form a nearly stoichiometric film of silicon carbide (SiC). An initial adlayer of $C_{60}$ may be formed on the substrate at a surface temperature below 900 K to promote an epitaxial silicon carbide layer. In addition, selective crystalline silicon carbide growth can be achieved on patterned silicon-silicon oxide samples.

Silicon carbide layers have been grown having thicknesses from 100 Å to one micron and greater. These layers can form microcomponents, which are manipulated and positioned as desired on a substrate surface. Alternatively, coatings of silicon carbide can be grown that conform to the shape of a component. Silicon carbide microcomponents have promise in a wide variety of applications because of their unique physical properties. These properties include a low friction coefficient, high degree of hardness, chemical inertness, high degree of strength (at high temperature), and high thermal conductivity.

DETAILED DESCRIPTION OF THE INVENTION

Figure 1A:
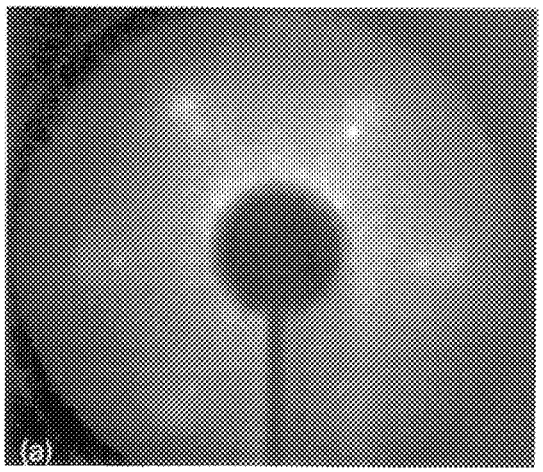
FIG. 1a shows a low energy electron diffraction (LEED) pattern at 107 eV from a silicon (111) surface with an incomplete SiC (111) adlayer.

The present invention is a method for forming silicon carbide on a silicon substrate via reaction of the substrate with $C_{60}$. The process takes place at temperatures below 1700 K (or below the melting point of silicon) in a hydrogen-free environment. The $C_{60}$ impinges on the substrate surface and reacts with silicon at the surface to form a nearly stoichiometric silicon carbide (SiC) film. Silicon carbide structures can be selectively grown on silicon-silicon oxide substrates at temperatures below 1250 K.

The silicon carbide structures are crystalline and epitaxial, i.e., the growth of a silicon carbide layer on a single crystal of another is such that the crystal structure in the layer is the same as that in the substrate. This type of growth is commonly used in making semiconductor devices. To promote epitaxy, an initial adlayer of $C_{60}$ may be formed on the substrate at temperatures below 900 K before forming the silicon carbide layer. The silicon substrate may be a Si (111) or Si (100) wafer, or silicon carbide may be grown as a coating on a microcomponent. This process could be applied with other metals and semiconducting materials that form carbides: for example, germanium, titanium, tantalum, and tungsten.

Film Growth

Silicon carbide films have been produced using an apparatus described by the applicants [7,8]; these articles are incorporated herein by reference. Briefly, the molecular beam scattering apparatus consists of three separate, differentially pumped vacuum chambers. The source chamber, pumped by a high-throughput diffusion pump, houses the annular $C_{60}$ Knudsen source and the mechanical chopper. The $C_{60}$ beam is collimated by a 1 mm orifice separating the source and target chambers. The silicon wafers (p-type, 5 ohm/cm) are heated via a button heater in the cryopumped target chamber (base pressure $<5\times10^{-10}$ Torr). Temperature measurement is performed via an infrared pyrometer, which views the sample through a fused silica window. The scattered $C_{60}$ is monitored by a quadrupole mass spectrometer (QMS) in the ion-pumped detector chamber (base pressure $<2\times10^{-10}$ Torr). The orifice separating the target and detector chambers is sized such that the QMS "views" the entire silicon sample.

The low energy electron diffraction (LEED) and Auger electron spectroscopy (AES) apparatus is equipped with a $C_{60}$ doser, reverse view LEED optics, and a cylindrical mirror analyzer (CMA). Silicon wafers are heated radiatively in the ultra high vacuum chamber (base pressure $<2\times10^{-10}$ Torr). The temperature is monitored via a K-type thermocouple attached to the sample face via a high temperature ceramic adhesive.

Silicon carbide film growth is observed as a result of continuous $C_{60}$ exposure to the silicon substrate at >1100 K for ~260 minutes. The $C_{60}$ may be in the form of vapor or in a solid form, such as a powder. Auger electron spectroscopy (AES) depth profile along with atomic force microscopy measurements confirmed the growth of approximately 5000 Å of stoichiometric silicon carbide. To achieve thicker films, silicon may be vaporized along with $C_{60}$ to deposit SiC on the silicon substrate.

Currently, the mechanism of silicon atom migration to the surface is not clear. Silicon atoms may arrive at the surface by self or vacancy diffusion through the silicon carbide layer or by silicon surface diffusion. Experimental results have ruled out the diffusion of carbon into the bulk. Long-range surface diffusion of silicon has been eliminated since the growth occurs over large areas, but surface diffusion does play a role in the SiC growth for small structures. The SiC growth process is modeled by solid state diffusion of silicon from the silicon-silicon carbide interface to the silicon carbide surface, where it reacts with $C_{60}$ to form silicon carbide.

In another embodiment, the silicon substrate is covered with a $C_{60}$ adlayer before forming the silicon carbide layer. This slower process promotes epitaxy of the silicon carbide and substrate. A silicon (111) substrate is placed in ultrahigh vacuum (UHV) and cleaned by heating to 1300 K for one minute to remove the silicon native oxide. A (7×7) LEED pattern is observed. The sample is exposed to a multilayer exposure of $C_{60}$ at room temperature. The sample is heated to 1200–1300 K, during which the multilayer desorbs (temperature for desorption ~580 K) and the monolayer reacts to nucleate SiC as observed in the AES. The LEED pattern shows only the Si (111)-(1×1) pattern.

Figure 1B:
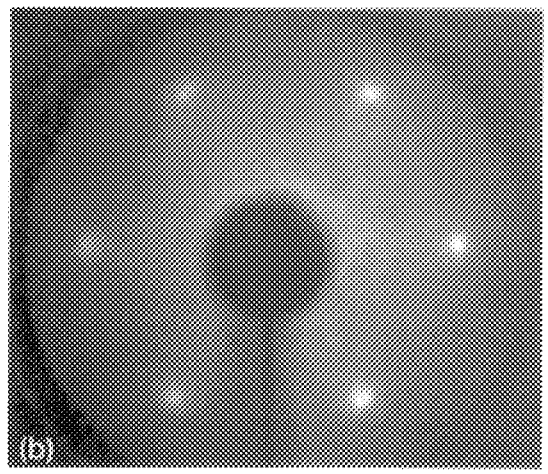
FIG. 1b shows a low energy electron diffraction (LEED) pattern at 107 eV from a ~2000 Å thick SiC (111) film surface.

The above procedure may be repeated several (3–4) times, producing the LEED pattern shown in FIG. 1a. The silicon substrate first order spots are still visible, and the SiC first order spots appear just outside the substrate spots. The 20% lattice mismatch between Si and SiC is seen in this LEED pattern. The sample is then heated to 1150 K and exposed continuously to $C_{60}$ for 30 minutes. The $C_{60}$ flux is held high so that the rate of growth is limited by the arrival of silicon atoms to the growing surface. The resulting LEED pattern after annealing to 1200 K is shown in FIG. 1b. Si (100)-(2×1) surfaces yield similar results.

Figure 2:
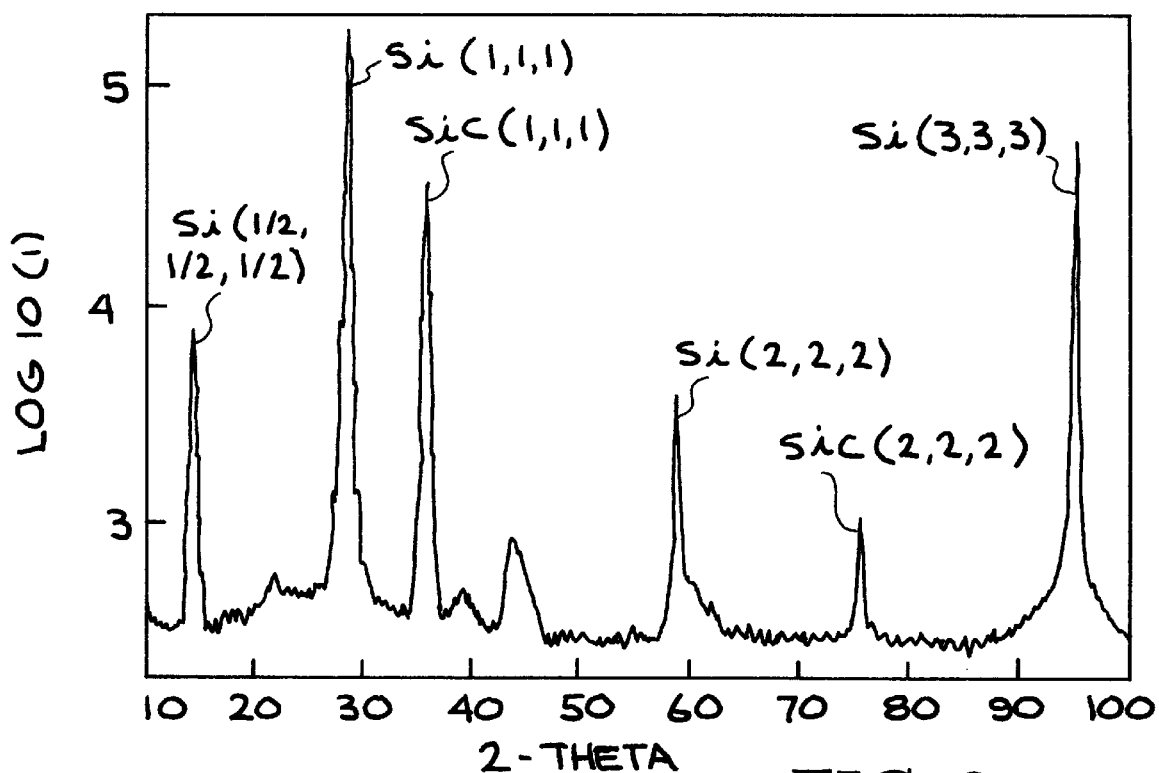
FIG. 2 shows x-ray diffraction intensity as a function of $2\theta$ angle from the silicon (111) substrate with ~2000 Å epitaxial SiC film.

The film grown on a Si (111) surface was characterized by x-ray diffraction shown in FIG. 2. The silicon substrate peaks corresponding to (1/2,1/2,1/2), (1,1,1), (2,2,2), and (3,3,3) are seen. Two peaks from the film are observed corresponding to cubic SiC (1,1,1) and SiC (2,2,2) or hexagonal SiC (0,0,0,1) and SiC (0,0,0,2). Polar figure analysis shows that cubic or β-SiC phase is responsible for these peaks for growth at 1200 K. The results suggest that the film is twinned.

Applicants have shown that epitaxial, crystalline thin films of silicon carbide can be grown on silicon substrates via $C_{60}$ precursors. The reaction probability for $C_{60}$ with silicon at low surface temperature (1000 K) is unity, allowing rapid growth rates depending on the reactant arrival rates. Films have been grown having thicknesses of 100 Å to greater than one micron. LEED measurements show the epitaxial relation between the substrate and the crystalline SiC film. Auger-sputter depth profiling shows the film is stoichiometric.

Growth of Patterned SiC Structures

Selective crystalline silicon carbide growth is achieved on patterned silicon-silicon oxide samples. The interaction of $C_{60}$ with the native oxide of silicon is very weak, i.e., weaker than the $C_{60}$—$C_{60}$ interaction. In contrast, the interaction of $C_{60}$ with silicon is very strong, i.e., much greater than the $C_{60}$—$C_{60}$ interaction. The difference in the strength of these interactions is the basis for the present process to pattern structures of SiC on a silicon wafer.

In particular, at temperatures greater than 900 K, $C_{60}$ has a negligible reaction probability on a silicon dioxide surface below 1200 K. However, $C_{60}$ reacts with silicon at surface temperatures above 900 K. The present process for growing patterned SiC films makes use of these properties of the $C_{60}$-surface interaction. By patterning a silicon wafer with areas of silicon dioxide via standard lithographic techniques and exposing the wafer to a flux of $C_{60}$ vapor, SiC will grow on the silicon wafer, but not on the silicon dioxide areas. The oxide layer can be removed by etching in standard hydrofluoric acid (HF) solution to leave behind a silicon wafer with SiC structures in place.

Figure 3:
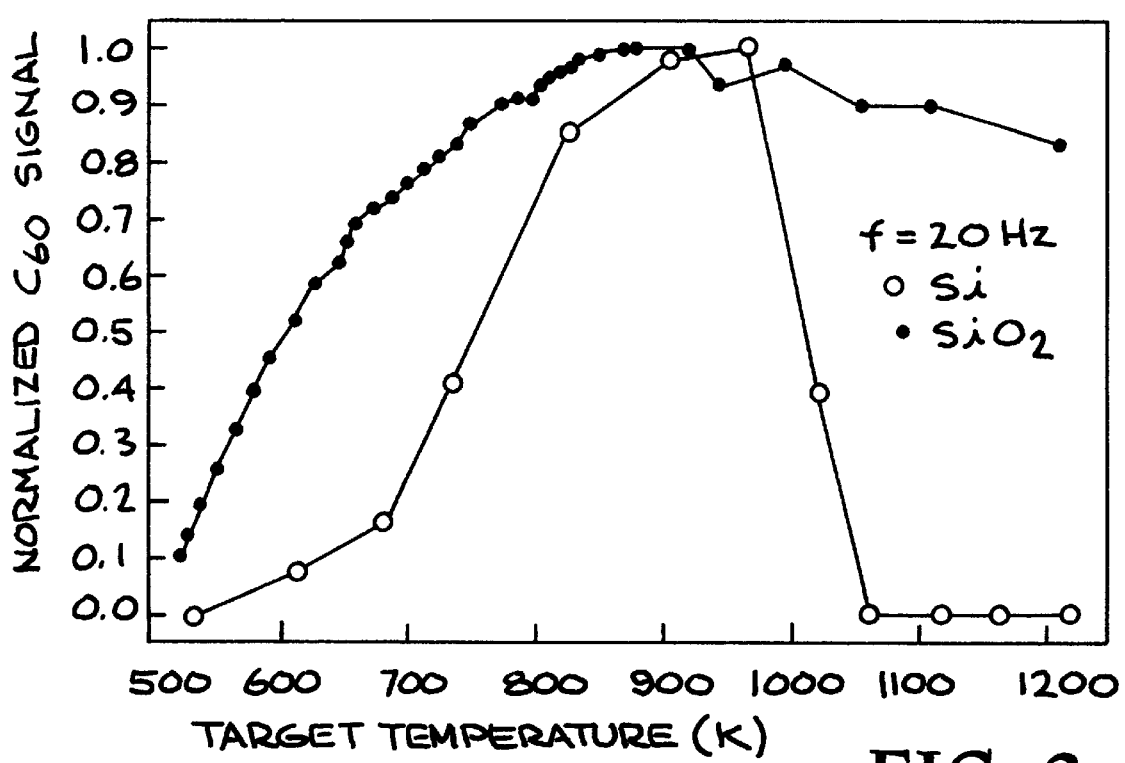
FIG. 3 shows normalized $C_{60}$ signal amplitude versus target temperature for silicon (open circles) and silicon dioxide (filled circles) targets.

The relative strength of the interaction of $C_{60}$ with silicon and silicon dioxide surfaces is observed for the modulated scattering of $C_{60}$ from these surfaces. FIG. 3 shows the signal amplitude for scattering of $C_{60}$ from a silicon (open circles) and a silicon dioxide (filled circles) substrate as a function of substrate temperature. At surface temperatures less than 900 K, $C_{60}$ scatters from a surface that is fully covered by a $C_{60}$ adlayer on silicon (100). From 600 K to 900 K, the signal amplitude increases because the shorter residence time of the $C_{60}$ on the surface eliminates the effects of demodulation of the signal. The steeper slope and the shift to higher surface temperature for the rise in the signal for the $C_{60}$-covered silicon surface versus the silicon dioxide surface is evidence of the stronger interaction of the $C_{60}$ with the $C_{60}$-covered silicon surface than with the silicon dioxide surface. At temperatures above 900 K on the silicon-$C_{60}$ substrate, the reaction of the adlayer with the silicon substrate proceeds. Therefore, scattering occurs from a reactive surface at temperatures greater than 900 K.

Patterned SiC films are produced in a manner similar to that described above. On a test wafer of Si (100), a one micron layer of silicon dioxide is thermally grown. The silicon dioxide layer is patterned using standard lithographic techniques to produce areas of silicon and areas of silicon dioxide. The test wafer is then placed in UHV and heated to 1200 K to clean off the native silicon oxide on the silicon areas. LEED from the silicon areas shows a (2×1) reconstructed surface.

Figure 4:
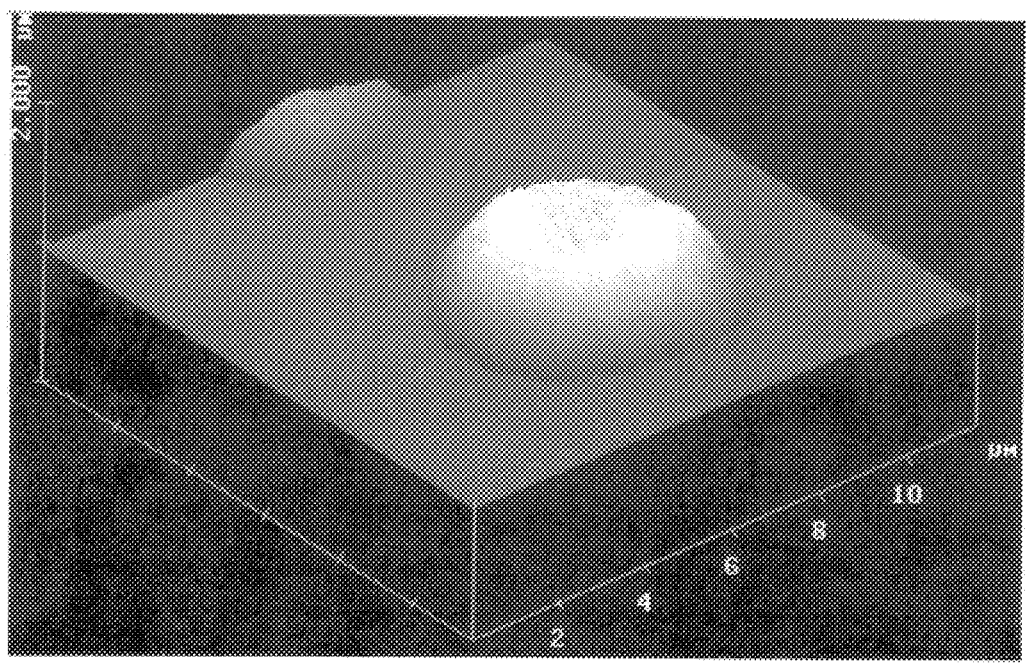
FIG. 4 shows an atomic force micrograph of a SiC dot, five microns in diameter and ~1 micron in height.

The surface is heated to 1100 K and exposed to $C_{60}$ continuously for about one hour. The surface may be exposed to $C_{60}$ at lower temperatures (<900 K) to form an adlayer of $C_{60}$ that will then react under higher temperatures (900 K to 1250 K) to form the silicon carbide layer. LEED of the formerly bare silicon areas shows a SiC LEED pattern. The sample is removed from UHV and placed in concentrated HF acid to remove the silicon dioxide film. An atomic force micrograph of one of the five micron dots in the structure is shown in FIG. 4. The height of the structure is about one micron. Thicker layers of silicon carbide may be achieved by simultaneously vaporizing silicon with $C_{60}$.

Adhesion of the silicon carbide microcomponents may be weak, and an atomic force microscope (AFM) tip can be used to release and manipulate the microcomponent. The AFM tip can then be used to position the microcomponent on a wafer. The reaction of $C_{60}$ with silicon has been used to conformally coat a silicon AFM tip with SiC. $C_{60}$ has large surface mobility on SiC and $C_{60}$-covered surfaces, and therefore the coating of the tip is uniform even though reaction surfaces may be inclined at various angles to the source.

The foregoing description of preferred embodiments of the invention is presented for purposes of illustration and description and is not intended to be exhaustive or to limit the invention to the precise form disclosed. Many modifications and variations are possible in light of the above teaching.

We claim:

1. A process for forming silicon carbide films and microcomponents on a silicon substrate, comprising:

forming a silicon carbide layer on a silicon substrate surface by heating the silicon surface in the presence of $C_{60}$ and silicon vapor.

2. A process as recited in claim 1, wherein forming the silicon carbide layer is carried out at a temperature between about 900 K and 1700 K.

3. A process as recited in claim 1, wherein forming the silicon carbide layer is carried out under vacuum.

4. A process as recited in claim 1, wherein forming the silicon carbide layer is carried out in the presence of $C_{60}$ vapor.

5. A process as recited in claim 1, wherein forming the silicon carbide layer is carried out in the presence of $C_{60}$ in a solid form.

6. A process as recited in claim 1, wherein the silicon carbide layer is greater than about one micron in thickness.

7. A process as recited in claim 1, wherein heating the silicon surface is carried out radiatively.

8. A process as recited in claim 1, wherein heating the silicon surface is carried out resistively.

9. A process as recited in claim 1, wherein the silicon carbide layer is stoichiometric (SiC).

10. A process as recited in claim 1, further comprising:

forming a $C_{60}$-covered silicon surface by exposing the silicon substrate surface to $C_{60}$ before forming the silicon carbide layer on the $C_{60}$-covered silicon surface.

11. A process as recited in claim 10, wherein forming the $C_{60}$-covered silicon surface is carried out at a temperature less than about 900 K.

12. A process as recited in claim 10, wherein the silicon carbide layer and silicon substrate are epitaxial.

13. A process as recited in claim 1, wherein the silicon substrate is selected from the group consisting of Si (100) wafers and Si (111) wafers.

14. A process for selectively forming silicon carbide films and microcomponents on a silicon substrate, comprising:

forming a silicon carbide layer on a patterned silicon and silicon oxide substrate surface by heating the silicon-silicon oxide surface in the presence of $C_{60}$;

removing the silicon dioxide from the substrate to form a patterned silicon carbide layer.

15. A process as recited in claim 14, wherein forming the silicon carbide layer is carried out at a temperature between about 900 K and 1250 K.

16. A process as recited in claim 14, further comprising:

forming a $C_{60}$-covered silicon surface by exposing the silicon-silicon oxide surface to $C_{60}$ before forming the silicon carbide layer on the $C_{60}$-covered silicon surface.

17. A process as recited in claim 16, wherein forming the $C_{60}$-covered silicon surface is carried out at a temperature less than about 900 K.

18. A process for forming carbide films and microcomponents on a metal substrate, comprising:

forming a carbide layer on a substrate surface by heating the surface in the presence of $C_{60}$, wherein the substrate is selected from the group consisting of germanium, tantalum, titanium, and tungsten.

19. A process as recited in claim 18, further comprising:

forming a $C_{60}$-covered substrate surface by exposing the substrate surface to $C_{60}$ before forming the carbide layer on the $C_{60}$-covered surface.

* * * * *